United States Patent
Wang et al.

(10) Patent No.: US 11,342,533 B2
(45) Date of Patent: May 24, 2022

(54) OLED DISPLAY PANEL AND PREPARATION METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Junyuan Wang, Hubei (CN); Cunjun Xia, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 231 days.

(21) Appl. No.: 16/613,465

(22) PCT Filed: Sep. 20, 2019

(86) PCT No.: PCT/CN2019/106922
§ 371 (c)(1),
(2) Date: Nov. 14, 2019

(87) PCT Pub. No.: WO2020/258544
PCT Pub. Date: Dec. 30, 2020

(65) Prior Publication Data
US 2021/0336211 A1   Oct. 28, 2021

(30) Foreign Application Priority Data
Jun. 26, 2019 (CN) .......................... 201910560833.6

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC ............ H01L 51/5253; H01L 27/3244; H01L 51/0097; H01L 51/56; H01L 2251/5338; H01L 51/5237; H01L 22/30
(Continued)

(56) References Cited

U.S. PATENT DOCUMENTS

| 9,054,336 B2 | 6/2015 | Park |
| 2005/0053719 A1 | 3/2005 | Ishida |

(Continued)

FOREIGN PATENT DOCUMENTS

| CN | 101320785 A | 12/2008 |
| CN | 103296057 A | 9/2013 |

(Continued)

*Primary Examiner* — Thinh T Nguyen (57) ABSTRACT

An organic light emitting diode (OLED) display panel and preparation method thereof, which includes an array substrate, an organic light emitting layer, and an encapsulation layer. The encapsulation layer includes organic-inorganic functional layer. Through disposing the organic-inorganic functional layer, the overall thickness of the encapsulation thin film can be reduced while ensuring the encapsulation effect, and the bending performance of the OLED device can be improved. Further, a mask plate is not required in the encapsulation process, thereby can effectively save production cost.

18 Claims, 5 Drawing Sheets

(51) Int. Cl.
*H01L 51/00* (2006.01)
*H01L 51/56* (2006.01)

(52) U.S. Cl.
CPC ........ *H01L 51/56* (2013.01); *H01L 2227/323* (2013.01); *H01L 2251/5338* (2013.01)

(58) Field of Classification Search
USPC ....................................... 257/40; 438/82, 99
See application file for complete search history.

(56) References Cited

U.S. PATENT DOCUMENTS

2008/0305360 A1     12/2008  Han
2018/0166653 A1      6/2018  Xie et al.
2019/0067639 A1*     2/2019  Jiang et al. ......... H01L 51/5256
                                                        257/40

FOREIGN PATENT DOCUMENTS

| CN | 104851846 A | 8/2015 |
| CN | 106816549 A | 6/2017 |
| JP | 2005044613 A | 2/2005 |

* cited by examiner

OLED DISPLAY PANEL AND PREPARATION METHOD THEREOF

FIELD OF INVENTION

The present disclosure relates to a display technology field, and particular to an organic light emitting diode (OLED) and a preparation method thereof.

BACKGROUND OF INVENTION

Because organic light emitting diode (OLED) devices have many advantages, such as being self-illuminous, high brightness, wide viewing angles, quick response speed, and can realize a flexible display, OLED devices have become a next generation display with great competitiveness and development prospects. Because OLED luminescent materials are very sensitive to water vapor, after being eroded by water vapor, the OLED devices easily age, and service life is shortened. Therefore, the OLED devices are required to be thin film encapsulated to isolate water vapor.

Current thin film encapsulation uses a method that alternately superimposes the organic layer and the inorganic layer to extend the water vapor intrusion path, so that the OLED devices have a flexible function while having a function of blocking the water vapor. However, by superimposing the organic layer and the inorganic layer, the process is not only complicated and has long product production cycle, the film layer thickness of the encapsulation layer is also thick, which is unfavorable to the OLED devices in development orientation of flexibility and thinness.

SUMMARY OF INVENTION

The present disclosure provides an organic light emitting diode (OLED) and a preparation method thereof to solve the problem in the current OLED display panel, that is, due to the encapsulation process of the current OLED display panels is complicated, and the film layer thickness of the encapsulation thin film is thick which makes the display panel being difficult to bend, thereby which is unfavorable to the OLED devices in development orientation of flexibility and thinness.

In order to solve the problems mentioned above, the present disclosure provides the technical solutions as follows:

The present disclosure provides an organic light emitting diode (OLED) display panel which includes an array substrate, an organic light emitting layer disposed on the array substrate, and an encapsulation layer disposed on the organic light emitting layer and covering the organic light emitting layer. The encapsulation layer includes an organic-inorganic functional layer and a second organic layer disposed on the organic-inorganic functional layer; a lateral surface of the organic-inorganic functional layer away from the organic light emitting layer is an inorganic film layer; a lateral surface of the organic-inorganic functional layer close to the organic light emitting layer is a first organic layer; and a plurality of inorganic particles are embedded inside the first organic layer.

In an embodiment of the present disclosure, the inorganic film layer is disposed on a surface of the first organic layer and covers the first organic layer.

In an embodiment of the present disclosure, the organic-inorganic functional layer is disposed on a lateral surface of the organic light emitting diode away from the array substrate.

In an embodiment of the present disclosure, material of the inorganic particles is same as material of the inorganic film layer, and the inorganic particles and the inorganic film layer are prepared by a same process.

In an embodiment of the present disclosure, a thickness of the inorganic film layer ranges from 0.001 μm to 0.1 μm.

The present disclosure provides an OLED display panel which includes an array substrate, an organic light emitting layer disposed on the array substrate, and an encapsulation layer disposed on the organic light emitting layer and covering the organic light emitting layer. The encapsulation layer includes an organic-inorganic functional layer.

In an embodiment of the present disclosure, a lateral surface of the organic-inorganic functional layer away from the organic light emitting layer is an inorganic film layer, a lateral surface of the organic-inorganic functional layer close to the organic light emitting layer is a first organic layer, and a plurality of inorganic particles are embedded inside the first organic layer.

In an embodiment of the present disclosure, the inorganic film layer is disposed on a surface of the first organic layer and covers the first organic layer.

In an embodiment of the present disclosure, the organic-inorganic functional layer is disposed on a lateral surface of the organic light emitting diode away from the array substrate.

In an embodiment of the present disclosure, material of the inorganic particles is same as material of the inorganic film layer, and the inorganic particles and the inorganic film layer are prepared by a same process.

In an embodiment of the present disclosure, a thickness of the inorganic film layer ranges from 0.001 μm to 0.1 μm.

In an embodiment of the present disclosure, material of the organic-inorganic functional layer is organic matter including silicon group.

In an embodiment of the present disclosure, the encapsulation layer further comprises a second organic layer disposed on the organic-inorganic functional layer.

The present disclosure provides a preparation method for an OLED display panel which includes:

step S10, providing an array substrate, and preparing a light emitting layer on the array substrate:

step S20, forming an organic-inorganic functional layer on the organic light emitting layer.

In an embodiment of the present disclosure, the preparation method further includes step S30, forming a second organic layer on the organic-inorganic functional layer.

In an embodiment of the present disclosure, the step S20 includes:

step S201, forming a first organic layer on the organic light emitting layer;

step S202, depositing inorganic material on a surface of the first organic layer to form an inorganic film layer. The inorganic film layer covers the first organic layer and part of the inorganic material is embedded inside the first organic layer.

In an embodiment of the present disclosure, material of the inorganic film layer is aluminum oxide ($Al_2O_3$).

In an embodiment of the present disclosure, the step S202 specifically includes:

depositing a thin film of aluminum oxide ($Al_2O_3$) on an entire surface of the first organic layer by an atomic layer deposition method, and part of the aluminum oxide embedded inside the first organic layer;

forming the inorganic film layer which is patterned on a surface of the first organic layer by an etching process.

In an embodiment of the present disclosure, a thickness of the inorganic film layer ranges from 0.001 μm to 0.1 μm.

In an embodiment of the present disclosure, the inorganic film layer covers the first organic layer.

In an embodiment of the present disclosure, material of the organic-inorganic functional layer is organic matter including silicon group.

The beneficial effect of the present disclosure: through disposing the organic-inorganic functional layer, the overall thickness of the encapsulation thin film can be reduced while ensuring the encapsulation effect, and the bending performance of the OLED device can be improved. Further, a mask plate is not required in the encapsulation process, thereby can effectively save production cost.

DESCRIPTION OF DRAWINGS

To more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

The descriptions of embodiments below refer to accompanying drawings in order to illustrate certain embodiments which the present disclosure can implement. The directional terms of which the present disclosure mentions, for example, "top," "bottom," "upper," "lower," "front," "rear," "left," "right," "inside," "outside," "side," etc., are just refer to directions of the accompanying figures. Therefore, the used directional terms are for illustrating and understanding the present disclosure, but not for limiting the present disclosure. In the figures, units with similar structures are used same labels to indicate.

The present disclosure aims at the problem of current organic light emitting diode (OLED) display panels, the problem is that due to the encapsulation process of the current OLED display panel is complicated, and the film layer thickness of the encapsulation thin film is thick which makes the display panel being difficult to bend, thereby which is unfavorable to the OLED device in the development orientation of flexibility and thinness, and embodiments of the present disclosure can solve such defects.

Figure 1:
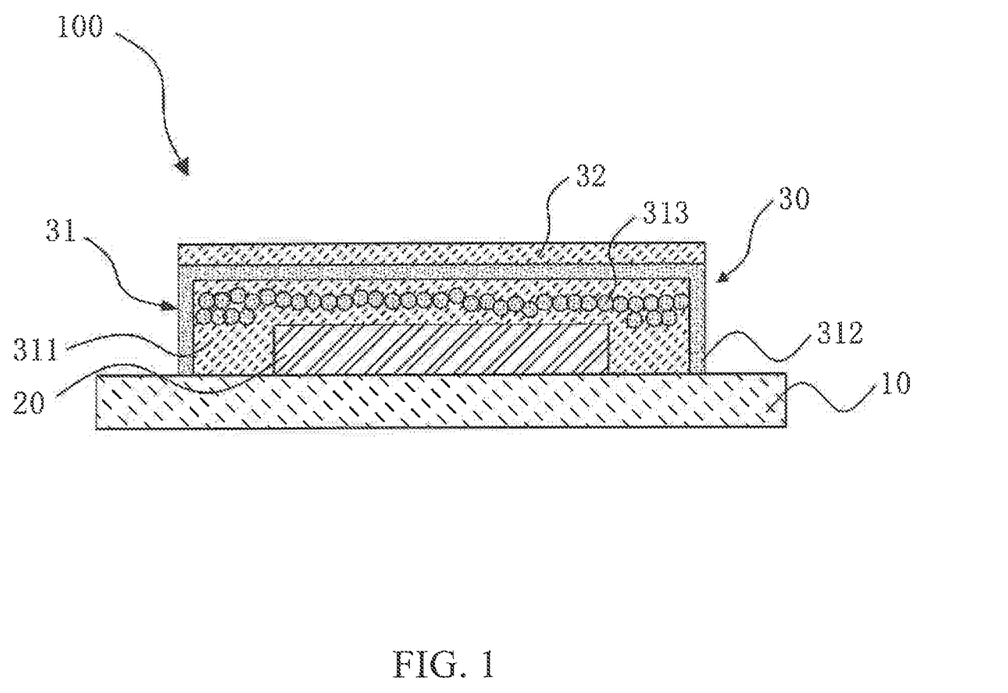
FIG. 1 is a structural schematic diagram of the organic light emitting diode (OLED) display panel of an embodiment of the present disclosure.

As illustrated in FIG. 1, an embodiment of the present disclosure provides an organic light emitting diode (OLED) display panel 100, which includes an array substrate 10, an organic light emitting layer 20, and an encapsulation layer 30.

The organic light emitting layer 20 is disposed on the array substrate 10; the encapsulation layer 30 is disposed on the organic light emitting layer 20, and the encapsulation layer 30 covers the organic light emitting layer 20.

The encapsulation layer 30 includes an organic-inorganic functional layer 31. Because the encapsulation layer in the prior art is disposed by overlapping the inorganic layer and the organic layer, the thickness of the film layer is thick, which makes unfavorable to the panel in development of thinness, and affects bending performance of the panel. Therefore, the embodiment of the present disclosure performs improvement on the encapsulation layer by embedding inorganic material which has a water-oxygen proof property into the organic layer with good bending effect, not only can reduce the thickness of the encapsulation layer, but also can improve bending performance of the OLED device.

A lateral surface of the organic-inorganic functional layer 31 away from the organic light emitting layer 21 is an inorganic film layer 312, a lateral surface of the organic-inorganic functional layer 31 close to the organic light emitting layer 20 is a first organic layer 311, and a plurality of inorganic particles 313 are embedded inside the first organic layer 311.

The inorganic film layer 312 is disposed on a surface of the first organic layer 311, and the inorganic film layer 312 covers the first organic layer 311. The inorganic particles 313 and the inorganic film layer 312 are prepared by a same process, that is, while inorganic material is deposited on a surface of the first organic layer 311 to form the inorganic film layer 312, the inorganic material is embedded in the interior of the first organic layer 311 to form the inorganic particles 313.

Material of the inorganic particles 313 and the inorganic film layer 312 is same, and the material is aluminum oxide ($Al_2O_3$).

For example, the inorganic particles 313 and the inorganic film layer 312 in the embodiment may be made of aluminum oxide, and the aluminum oxide is deposited on a surface of the first organic layer 311 by an atom injected type atomic layer deposition method. Since the organic layer has loose texture, the water proof property is poor, and depositing the aluminum oxide by the atomic layer deposition method has an all-pervasive characteristic, that is, the aluminum oxide can enter into every nook and cranny, so that the aluminum oxide can be injected into the organic layer. While the aluminum oxide inorganic film layer is formed on the surface of the organic layer 311, the aluminum oxide inorganic particles are formed inside the first organic layer 311, thereby realizing an organic-inorganic hybrid encapsulation method. This kind of encapsulation layer method effectively ensures to prevent from intrusion of water and oxygen, and meanwhile can not only reduce the film thickness of the encapsulation layer for advantageously bending, but also simplify the encapsulation process and save cost.

A thickness of the aluminum oxide inorganic film layer ranges from 0.001 μm to 0.1 μm. If the thickness is too thick, the product production cycle will be prolonged, and if the thickness is too thin, the water-oxygen proof property will be too poor.

In this embodiment, the organic-inorganic functional layer 31 is disposed on a lateral surface of the organic light emitting layer 20 away from the array substrate 10. Specifically, the first organic layer 311 is disposed on an upper surface of the organic light emitting layer 20, and the first organic layer 311 covers the organic light emitting layer 20.

Based on this embodiment, the encapsulation layer 30 further includes a second organic layer 32, and the second organic layer 32 is disposed on the organic-inorganic functional layer 32, for improving bending performance of the display panel.

The array substrate 10 includes a base substrate and a thin film transistor array, and the array substrate is a flexible substrate or a rigid substrate.

The organic light emitting layer 20 includes devices such as an anode, a hole injection layer, a hole transport layer, an organic light emitting material layer, an electron transport layer, an electron transport layer, an electron injection layer, and a cathode.

This embodiment further provides a preparation method for the OLED display panel 100 mentioned above, which includes:

Step S10, providing an array substrate 10, and preparing a light emitting layer 20 on the array substrate 10.

Step S20, forming an organic-inorganic functional layer 31 on the organic light emitting layer 20.

Figure 2:
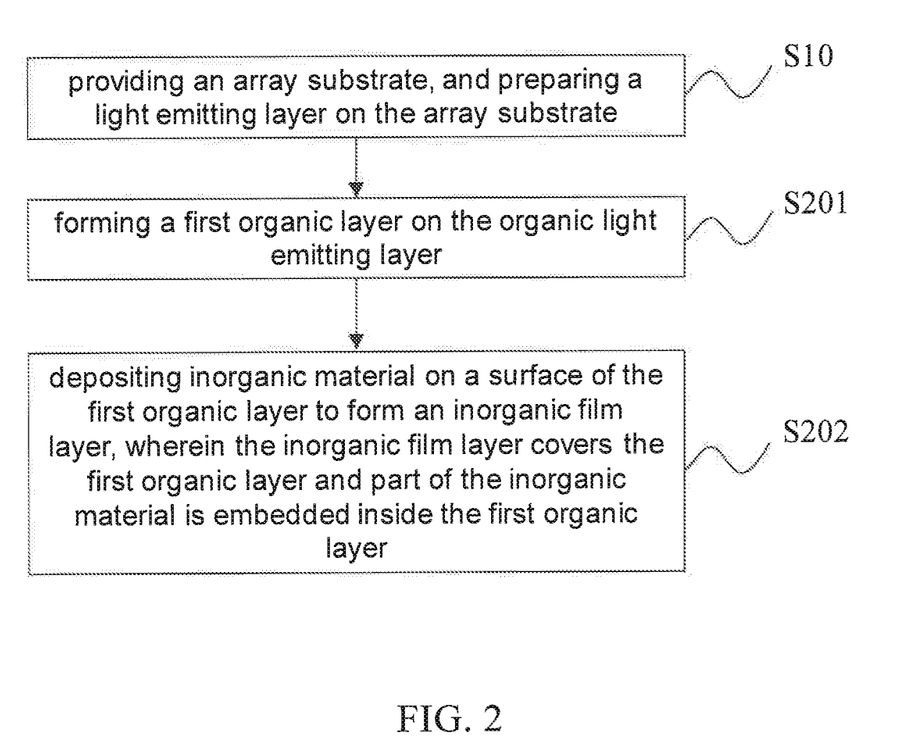
FIG. 2 is a flowchart of the preparation method for the OLED display panel of an embodiment of present disclosure.

As illustrated in FIG. 2, the preparation method will be described in detail as follow.

The step S20 includes: step S201, forming a first organic layer 311 on the organic light emitting layer 20; step S202, depositing inorganic material on a surface of the first organic layer 311 to form an inorganic film layer 312. The inorganic film layer 312 covers the first organic layer 311 and part of the inorganic material is embedded inside the first organic layer 311.

Figure 3:
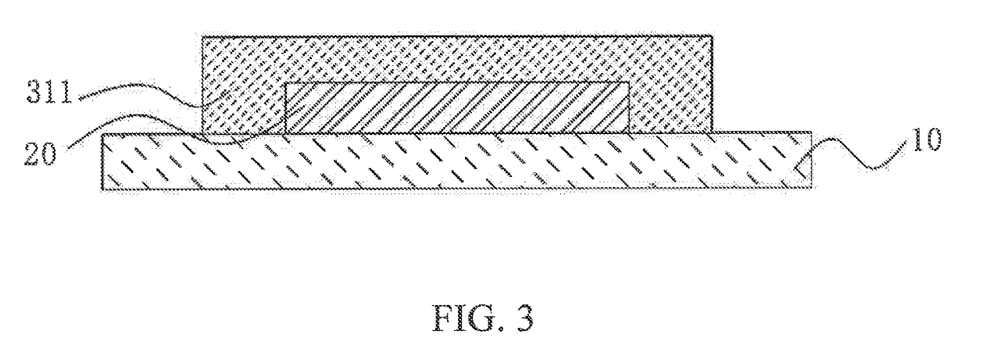
FIG. 3 to FIG. 5 are structural schematic diagrams of preparation processes of the OLED display panel of embodiments of the present disclosure.

As illustrated in FIG. 3, an array substrate 10 is provided, the array substrate 10 includes a base substrate and a thin film transistor array. A light emitting layer 20 is prepared on the array substrate 10, and then by an ink printing method or a coating method, the first organic layer 311 is prepared on the organic light emitting layer 20, and the first organic layer 311 covers the organic light emitting layer 20.

Figure 4:
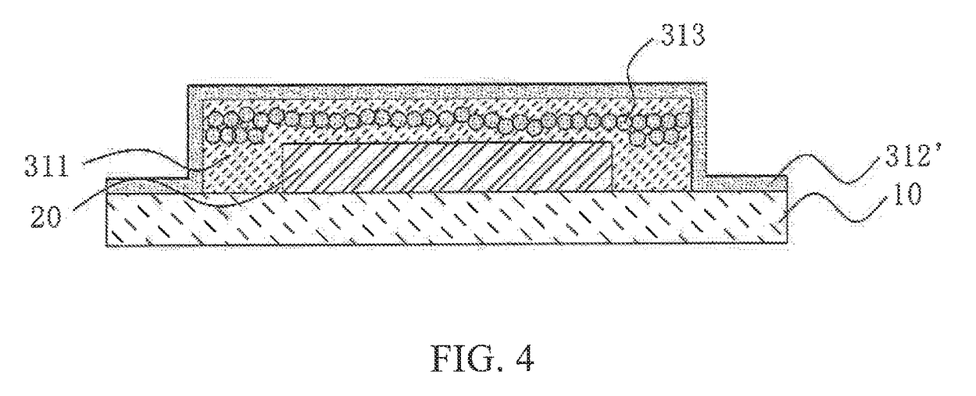

As illustrated in FIG. 4, depositing an aluminum oxide thin film 312' on an entire surface of the first organic layer 311 and the array substrate 10 by an atom injected type atomic layer deposition method. Since the organic layer has loose texture, and depositing the aluminum oxide by the atomic layer deposition method has a all-pervasive characteristic, that is, the aluminum oxide can enter into every nook and cranny, so that part of the aluminum oxide can be injected inside the first organic layer 311 to form aluminum oxide inorganic particles 313 through the surface of the first organic layer 311; the inorganic particles 313 form an inorganic interface inside the first organic layer 311 for compensating the poor water-oxygen proof property of the first organic layer 311.

Figure 5:
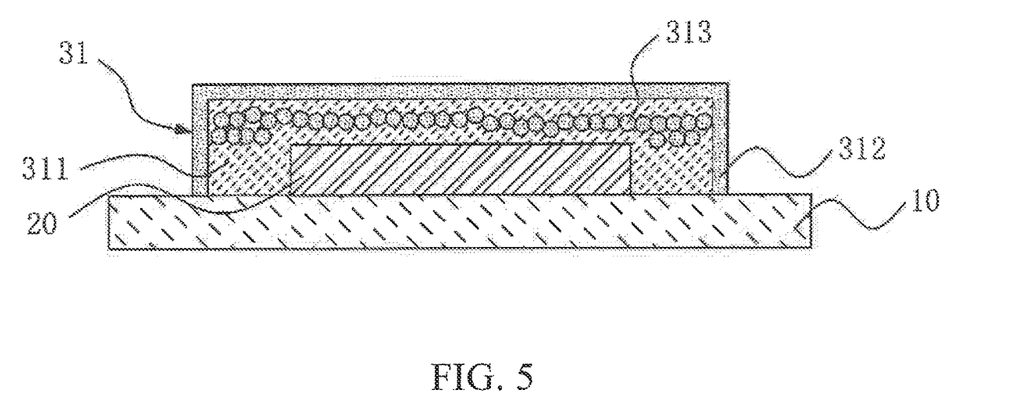

As illustrated in FIG. 5, then, performing an etch process on the aluminum oxide film 312' to etch away the area where does not require to encapsulate, and forming the inorganic film layer 312 which is patterned on a surface where is required to be encapsulated.

In other embodiments, the organic-inorganic functional layer 31 can be formed by embedding silicon material into the organic layer. Through a sol-gel method, trichloroethylsilane and dihydroxydiphenylsilane can be baked under nitrogen ($N_2$) at a high temperature for four hours to prepare a colorless and transparent oligomeric silicone resin, and then the oligomeric silicone resin and $SiO_2$-contained Nanopox® E600 (a dispersion of silica nanoparticles in a cycloaliphatic epoxy resin) is combined to form a silicon-contained organic substance with water-oxygen proof property, and then by a method of coating the silicon-contained organic substance on the organic light-emitting layer 20 to form the organic-inorganic functional layer for using.

Compared with a conventional encapsulation method of depositing an inorganic layer and an organic layer alternately, the organic-inorganic hybridization method used by the embodiments of the present disclosure makes the encapsulation structure have both water-oxygen proof property of the inorganic layer, and flat and bending property of the organic layer. Since it is only one layer structure, it is advantageous to reduce the thickness of the encapsulation layer, so that the OLED device can be developed into a light, thin, and bendable orientation.

Based on the embodiments mentioned above, the second organic layer 32 can be prepared on the organic-inorganic functional layer 31 by a coating method or an ink printing method to enhance the bending performance of the OLED device.

The beneficial effect is that through disposing the organic-inorganic functional layer, the overall thickness of the encapsulation thin film can be reduced while ensuring the encapsulation effect, and the bending performance of the OLED device can be improved. Further, a mask plate is not required in the encapsulation process, thereby can effectively save production cost.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. An organic light emitting diode (OLED) display panel, comprising:
    an array substrate;
    an organic light emitting layer disposed on the array substrate; and
    an encapsulation layer disposed on the organic light emitting layer and covering the organic light emitting layer;
    wherein the encapsulation layer comprises an organic-inorganic functional layer and a second organic layer disposed on the organic-inorganic functional layer,
    wherein the organic-inorganic functional layer comprises an inorganic film layer and a first organic layer; the inorganic film layer is located on a lateral surface of the organic-inorganic functional layer away from the organic light emitting layer; the first organic layer is located on a lateral surface of the organic-inorganic functional layer close to the organic light emitting layer; and a plurality of inorganic particles are embedded inside the first organic layer and form an inorganic interface, and
    wherein the first organic layer comprises a first section, the inorganic interface, and the second section; the inorganic interface covers the first section; and the second section of the first organic layer covers the inorganic interface.

2. The OLED display panel as claimed in claim 1, wherein the inorganic film layer is disposed on a surface of the first organic layer and covers the first organic layer.

3. The OLED display panel as claimed in claim 1, wherein the organic-inorganic functional layer is disposed on a lateral surface of the organic light emitting layer away from the array substrate.

4. The OLED display panel as claimed in claim 1, wherein material of the inorganic particles is same as material of the inorganic film layer, and the inorganic particles and the inorganic film layer are prepared by a same process.

5. The OLED display panel as claimed in claim 1, wherein a thickness of the inorganic film layer ranges from 0.001 μm to 0.1 μm.

6. An organic light emitting diode (OLED) display panel, comprising:
an array substrate;
an organic light emitting layer disposed on the array substrate; and
an encapsulation layer disposed on the organic light emitting layer and covering the organic light emitting layer;
wherein the encapsulation layer comprises an organic-inorganic functional layer,
wherein the organic-inorganic functional layer comprises an inorganic film layer and a first organic layer; the inorganic film layer is located on a lateral surface of the organic-inorganic functional layer away from the organic light emitting layer; and the first organic layer is located on a lateral surface of the organic-inorganic functional layer close to the organic light emitting layer; and a plurality of inorganic particles are embedded inside the first organic layer and form an inorganic interface, and
wherein the first organic layer comprises a first section, the inorganic interface, and the second section; the inorganic interface covers the first section; and the second section of the first organic layer covers the inorganic interface.

7. The OLED display panel as claimed in claim 6, wherein the inorganic film layer is disposed on a surface of the first organic layer and covers the first organic layer.

8. The OLED display panel as claimed in claim 6, wherein the organic-inorganic functional layer is disposed on a lateral surface of the organic light emitting diode away from the array substrate.

9. The OLED display panel as claimed in claim 6, wherein material of the inorganic particles is same as material of the inorganic film layer, and the inorganic particles and the inorganic film layer are prepared by a same process.

10. The OLED display panel as claimed in claim 6, wherein a thickness of the inorganic film layer ranges from 0.001 μm to 0.1 μm.

11. The OLED display panel as claimed in claim 6, wherein material of the organic-inorganic functional layer is organic matter comprising silicon group.

12. The OLED display panel as claimed in claim 6, wherein the encapsulation layer further comprises a second organic layer disposed on the organic-inorganic functional layer.

13. A preparation method for an organic light emitting diode (OLED) display panel, comprising:
step S10, providing an array substrate, and preparing a light emitting layer on the array substrate;
step S20, forming an organic-inorganic functional layer on the organic light emitting layer,
wherein the step S20 comprises:
step S201, forming a first organic layer on the organic light emitting layer;
step S202, depositing inorganic material on a surface of the first organic layer to form an inorganic film layer, wherein the inorganic film layer covers the first organic layer, a part of the inorganic material is embedded inside the first organic layer and forms an inorganic interface, the first organic layer comprises a first section, the inorganic interface, and the second section, the inorganic interface covers the first section, and the second section of the first organic layer covers the inorganic interface.

14. The preparation method as claimed in claim 13, wherein the preparation method further comprises step S30, forming a second organic layer on the organic-inorganic functional layer.

15. The preparation method as claimed in claim 13, wherein the step S202 comprises:
depositing a thin film of aluminum oxide (Al2O3) on an entire surface of the first organic layer by an atomic layer deposition method, and part of the aluminum oxide embedded inside the first organic layer;
forming the inorganic film layer which is patterned on a surface of the first organic layer by an etching process.

16. The preparation method as claimed in claim 15, wherein a thickness of the inorganic film layer ranges from 0.001 μm to 0.1 μm.

17. The preparation method as claimed in claim 15, wherein the inorganic film layer covers the first organic layer.

18. The preparation method as claimed in claim 13, material of the organic-inorganic functional layer is organic matter comprising silicon group.

* * * * *